United States Patent
Jin et al.

(10) Patent No.: US 9,423,780 B2
(45) Date of Patent: Aug. 23, 2016

(54) HANDHELD DEVICE FOR PREVENTING MISOPERATIONS IN AN ELECTRIC POWER SYSTEM

(71) Applicant: Youtech, Inc., Mountain View, CA (US)

(72) Inventors: Shuqiang Jin, Zhuhai (CN); Lingzhi Pang, Zhuhai (CN); Liguo Wan, Zhuhai (CN); Jiandong Huang, Zhuhai (CN); Hongping Jiang, Zhuhai (CN)

(73) Assignee: YOUTECH, INC., Mountain View, CA (US)

( * ) Notice: Subject to any disclaimer, the term of this patent is extended or adjusted under 35 U.S.C. 154(b) by 646 days.

(21) Appl. No.: 13/656,554

(22) Filed: Oct. 19, 2012

(65) Prior Publication Data

US 2014/0114638 A1    Apr. 24, 2014

(51) Int. Cl.
| | |
|---|---|
| G05B 17/02 | (2006.01) |
| H02H 11/00 | (2006.01) |
| G06F 17/50 | (2006.01) |
| G07C 9/00 | (2006.01) |
| G05B 13/04 | (2006.01) |
| G05B 23/02 | (2006.01) |

(52) U.S. Cl.
CPC .......... *G05B 17/02* (2013.01); *G06F 17/5009* (2013.01); *H02H 11/008* (2013.01); *G05B 13/048* (2013.01); *G05B 23/0243* (2013.01); *G06F 17/5036* (2013.01); *G07C 9/00309* (2013.01); *G07C 9/00571* (2013.01); *G07C 9/00817* (2013.01)

(58) Field of Classification Search
None
See application file for complete search history.

(56) References Cited

U.S. PATENT DOCUMENTS

| | | | | |
|---|---|---|---|---|
| 4,549,176 A | * | 10/1985 | Kreft | 340/5.63 |
| 4,767,941 A | * | 8/1988 | Brand et al. | 307/43 |
| 2004/0159135 A1 | * | 8/2004 | Kato et al. | 70/278.3 |
| 2009/0271168 A1 | * | 10/2009 | Minto et al. | 703/17 |
| 2010/0204948 A1 | * | 8/2010 | Kirrmann et al. | 702/117 |
| 2012/0206235 A1 | * | 8/2012 | Jin et al. | 340/5.64 |

FOREIGN PATENT DOCUMENTS

WO    WO 2011057434 A1 *  5/2011

OTHER PUBLICATIONS

Terwiesch, et al., "Trends in automation." In Springer Handbook of Automation, Springer Berlin Heidelberg, 2009, pp. 127-143.*

* cited by examiner

*Primary Examiner* — Kamini S Shah
*Assistant Examiner* — David M Rogers
(74) *Attorney, Agent, or Firm* — Shun Yao; Park, Vaughan, Fleming & Dowler LLP (57) ABSTRACT

One embodiment of the present invention provides a system for performing a real-time, in-the-field switching-sequence simulation for a power system that includes a plurality of switching devices. During operation, the system receives a request, from a user at a handheld device, to perform an operation on a switching device in the power system. In response to the request, the system identifies the switching device from the plurality of switching devices, obtains instant status information associated with the plurality of switching devices, and runs a simulation, at the hand-held device, based on the instant status information and the identified switch device. The system then determines whether the operation is allowed based on an outcome of the simulation.

21 Claims, 10 Drawing Sheets

HANDHELD DEVICE FOR PREVENTING MISOPERATIONS IN AN ELECTRIC POWER SYSTEM

RELATED APPLICATION

The subject matter of this application is related to the subject matter of the following application:

U.S. patent application Ser. No. 13/473,437, entitled "METHOD AND SYSTEM FOR PREVENTING MISOPERATION IN AN ELECTRIC POWER SYSTEM," by inventors Shuqiang Jin, Lingzhi Pang, Liguo Wan, Jiandong Huang, and Hongping Jiang, filed 16 May 2012;

U.S. patent application Ser. No. 13/475,451, entitled "INTERCHANGEABLE LOCK CORE AND OPENING METHOD THEREOF," by inventors Shuqiang Jin, Qing Chang, Hongwei Qiao, Lei Ji, and Shuiping Liao, filed 18 May 2012; and U.S. patent application Ser. No. 13/475,605, entitled "METHOD AND APPARATUS FOR PERFORMING REAL-TIME, IN-THE-FIELD SWITCHING-ORDER SIMULATION FOR AN ELECTRIC POWER SYSTEM," by inventors Shuqiang Jin, Lingzhi Pang, Liguo Wan, Jiandong Huang, and Hongping Jiang, filed 18 May 2012;

the disclosures of which are incorporated by reference in their entirety herein.

COLOR DRAWINGS

The patent or application file contains at least one drawing executed in color. Copies of this patent or patent application publication with color drawing(s) will be provided by the Office upon request and payment of the necessary fee.

BACKGROUND

1. Field

The present disclosure relates generally to preventions of misoperations in an electric power system. More specifically, the present disclosure relates to a handheld device for preventing misoperations in an electric power system.

2. Related Art

In complex electric power plants or transmission substations, where various types of equipment are operating at high voltages, switching errors can lead to disastrous outcomes, such as interruptions of power, damages to equipment, and loss of human life. A number of factors can cause switching errors, including equipment failure, faults of the control system, human error, and inadequate interlocking devices. Statistics have shown that most switching errors are caused by human error, which can be prevented with proper interlocking design.

Common switching errors include energizing a grounded line, closing a ground switch when energized, de-energizing or load dropping using a disconnector instead of a breaker, or entering an energized switching bay. In order to prevent these switching errors, it is essential to ensure that the correct switching sequence is followed by the switching personnel. In addition, the switching personnel must be fully aware of the impact of each switching step and have the assurance that the next step is proven safe before the actual switching takes place. This requires a simulation system that models the connectivity of a substation and the interlocking logic among the switching operations. Before operating on a piece of equipment, a worker is required to perform a switching-sequence simulation, which verifies whether the sequence of operations complies with safety rules and regulations. If an operation step violates a safety rule, the simulation system notifies the worker such operation cannot proceed.

Conventional switching-sequence simulation systems rely on human programmers to generate and input logic expressions that describe operation of the equipment, which can require a huge amount of work for a large-scale, complex power system, and thus is prone to unintended omissions or typographical errors. In addition, certain complex circuit configurations, such as a bridge-circuit configuration, may involve complex logic due to interconnections among associated devices, making it difficult to summarize all possible operating modes.

SUMMARY

One embodiment of the present invention provides a system for performing a real-time, in-the-field switching-sequence simulation for a power system that includes a plurality of switching devices. During operation, the system receives a request, from a user at a handheld device, to perform an operation on a switching device in the power system. In response to the request, the system identifies the switching device from the plurality of switching devices, obtains instant status information associated with the plurality of switching devices, and runs a simulation, at the hand-held device, based on the instant status information and the identified switch device. The system then determines whether the operation is allowed based on an outcome of the simulation.

In a variation on this embodiment, the hand-held device is a smart key, which is configured to unlock a lock associated with the switching device, thus facilitating performance of the operation.

In a further variation, identifying the switching device involves using the hand-held device to check an RFID associated with the switching device.

In a variation on this embodiment, the plurality of switching devices includes one or more automated switching devices and one or more manually operated switching device.

In a variation on this embodiment, the system updates status of the switching device after of the operation is performed.

In a variation on this embodiment, in response to the operation being allowed, the system displays a message to the user indicating the operation being allowed; and in response to the operation not being allowed, the system displays an error message.

In a variation on this embodiment, the handheld device receives topology information associated with the power system and a set of user-definable rules that are independent of the power system topology.

In a variation on this embodiment, running the simulation involves defining and performing a search that traverses the topology based on the set of rules.

BRIEF DESCRIPTION OF THE FIGURES

In the figures, like reference numerals refer to the same figure elements.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide a handheld device for preventing misoperations in a power system. Before performing a switching operation, a field staff member carries the handheld device to the field where the switching device is located. The handheld device is configured to obtain the instant status information of other equipments associated with the operation, and performs a real-time switching-sequence simulation based on the obtained instant status information. The simulation result indicates whether the switching operation is allowable.

Smart-Interlock System

Figure 1A:
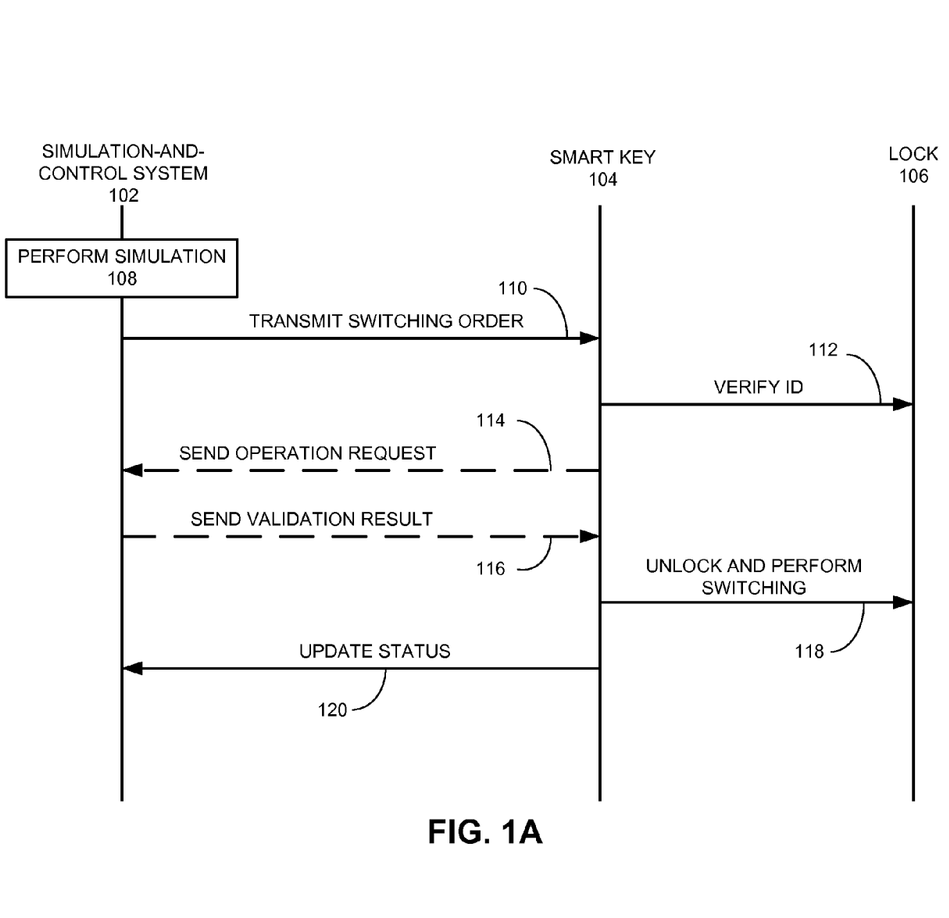
FIG. 1A presents a diagram illustrating the process of the "five-step" method, in accordance with an embodiment of the present invention.

To prevent possible switching errors involved in a switching operation, in embodiments of the present invention, a transmission substation or a switching/dispatching center implements a smart-interlock system (SIS), which combines the reliability of mechanical interlocking and the flexibility of electrical interlocking. The SIS includes a central simulation-and-control system, a smart key, and various types of locks associated with field equipment. During operation, the SIS uses a "five-step" method to ensure switching safety. The five steps for performing safe switching include: a simulation step, a switching-order transmission step, a device ID verification step, an operation-permission revalidation step, and a switching-completion step. FIG. 1A presents a diagram illustrating the process of the "five-step" error-prevention method, in accordance with an embodiment of the present invention.

Before an actual switching takes place, a simulation is performed to ensure that the proposed switching sequence is safe (operation 108). Note that this simulation can be performed by a simulation-and-control system 102 located in the substation control room. The switching-sequence simulation outputs a switching order that specifies which equipment is to be operated on and the order of the operations. Subsequently, the switching order is transmitted to a smart key 104 during the switching-order transmission step (operation 110). Smart key 104 is a handheld device that is capable of communicating, using various wireless communication protocols (such as ZigBee or CDMA), with the simulation-and-control system. In addition, smart key 104 is capable of interacting and unlocking various locks, such as a lock 106, associated with the field equipment. Note that the locks are attached to the equipment, and operations on the equipment require unlocking these locks using smart key 104. Smart key 104 can be carried by a person designated to perform the switching operation in the field, where the equipment is located. For example, before that field person pushes the handle of a knife switch, he first needs to unlock a lock that fixes the handle to its position. Or, before the field person enters a breaker bay to perform switching operations, he needs to first unlock the door of the breaker bay. During the device-ID verification step, the field person uses smart key 104 to verify that the equipment to be operated on is the identified equipment by checking an identifier associated with the equipment (operation 112). Such equipment identifier can be implemented by a lock identifier. For example, a lock (such as a padlock) attached to the equipment can be embedded with a radio frequency identification (RFID) tag, and an RFID detector included in the smart key can read this RFID in order to verify the identity of the lock, and thus the identity of the equipment. Optionally, subsequent to verifying the ID of the equipment to be operated on, the field person can further revalidate the operation by sending the operation request for the current equipment back to simulation-and-control system 102 via smart key 104 (operation 114) and receiving a validation result from simulation-and-control system 102 (operation 116). Subsequent to receiving the revalidation result, the field person uses smart key 104 to unlock lock 106 (either an electronic lock or a mechanical lock) and performs the actual switching (operation 118). For example, the field person may need to unlock a padlock in order to move the swing handle of a disconnect switch; or he may need to unlock a lock on the door of a cabinet in order to operate on equipment inside the cabinet. Note that the operation can be a manual operation that requires the field person to physically move a switch handle or an automated, electrically operated operation. After completion of the switching operation, smart key 104 updates the status of the equipment by transmitting its current status back to simulation-and-control system 102 (operation 120).

Figure 1B:
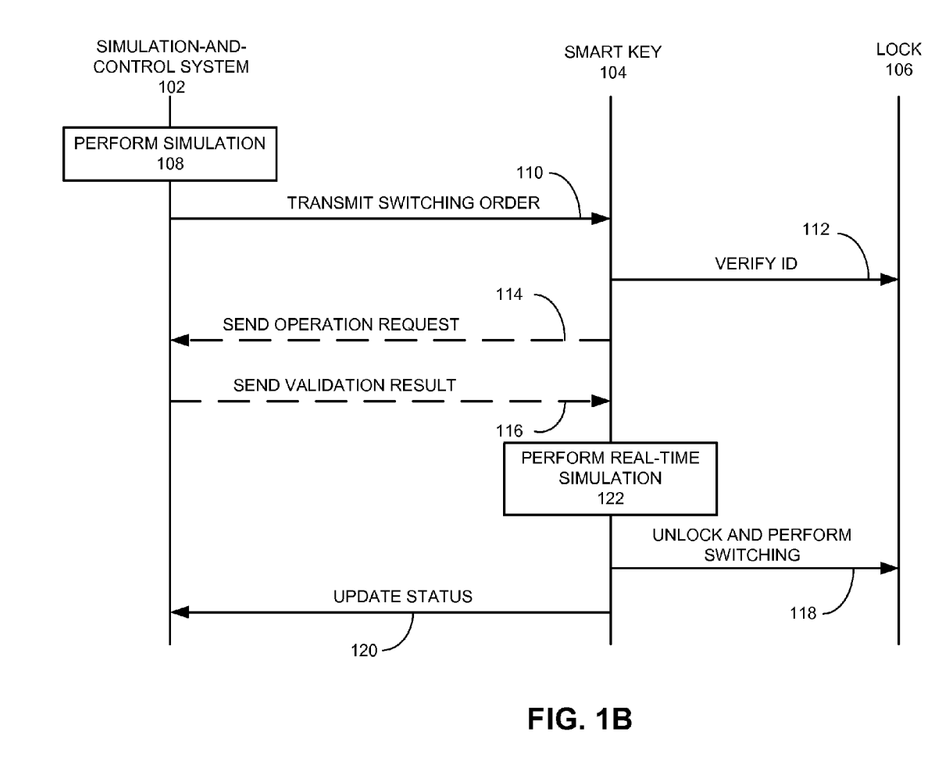
FIG. 1B presents a diagram illustrating an exemplary error-prevention process, in accordance with an embodiment of the present invention.

In one embodiment, in addition to obtaining the simulated switching order, smart key 104 performs an additional operation-verification step, which involves running a real-time, in-the-field switching-order simulation. FIG. 1B presents a diagram illustrating an exemplary error-prevention process, in accordance with an embodiment of the present invention. In FIG. 1B, the operations performed by simulation-and-control system 102 and smart key 104 are similar to the operations shown in FIG. 1A. More specifically, simulation-and-control system 102 performs the switching-sequence simulation (operation 108) and transmits the switching order to smart key 104 (operation 110). Smart key 104 verifies the equipment to be operated on by verifying the ID of lock 106 (operation 112). Subsequently, smart key 104 revalidates the switching operation by communicating with simulation-and-control system 102 (operations 114 and 116). Unlike the process shown in FIG. 1A, in FIG. 1B, prior to unlocking lock 106, smart key 104 performs a switching-sequence simulation (operation 122). Because the switching-sequence simulation is performed by smart key 104 right before the switching operation, this simulation is a real-time simulation. Performing a real-time switching-sequence simulation can be advantageous, especially in the scenario where the status of certain equipment has changed after simulation-and-control system 102 performs the initial switching-sequence simulation. Such a status change may result in the previously generated switching order being flawed. For example, the previously run simulation may indicate that a closing operation on a knife switch is a safe operation. However, before the field staff member performs such an operation, a circuit breaker coupled to the knife switch may change its status from open to closed, thus rendering the knife switch closing operation unsafe. Hence, a real-time, in-the-field switching-sequence simulation is needed to prevent execution of the unsafe operation. In one embodiment, smart key 104 receives real-time status information of certain automated devices from a supervisory control and data acquisition (SCADA) system coupled to those devices. In a further embodiment, a server (such as a server at which simulation-and-control system 102 resides) relays the SCADA data to smart key 104. Note that real-time status information for manually operated devices, such as fence doors and temporary ground wires, are collected and reported by smart keys.

Simulation-and-Control System

Figure 2:
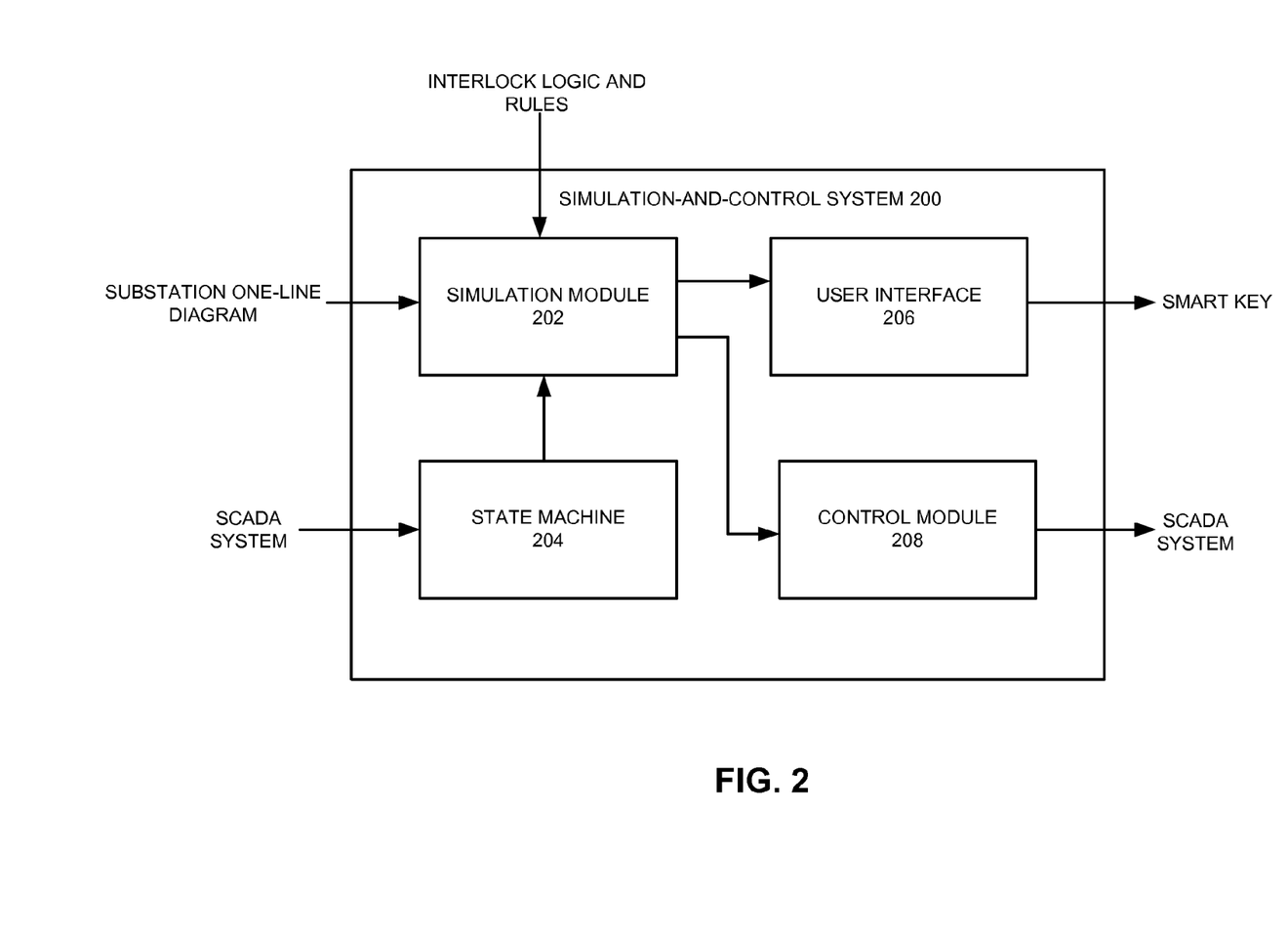
FIG. 2 presents a diagram illustrating the architecture of a simulation-and-control system, in accordance with an embodiment of the present invention.

The simulation-and-control system is an essential part of the SIS. It uses the one-line diagram of a substation to obtain the circuitry topology; collects current equipment status; collects and models switching interlock logic and rules; and simulates the switching sequence based on the circuitry topology, current equipment status, and switching interlock logic and rules. FIG. 2 presents a diagram illustrating the architecture of a simulation-and-control system, in accordance with an embodiment of the present invention. Simulation-and-control system 200 includes a simulation module 202, a state machine 204, a user interface 206, and a control module 208.

Figure 3:
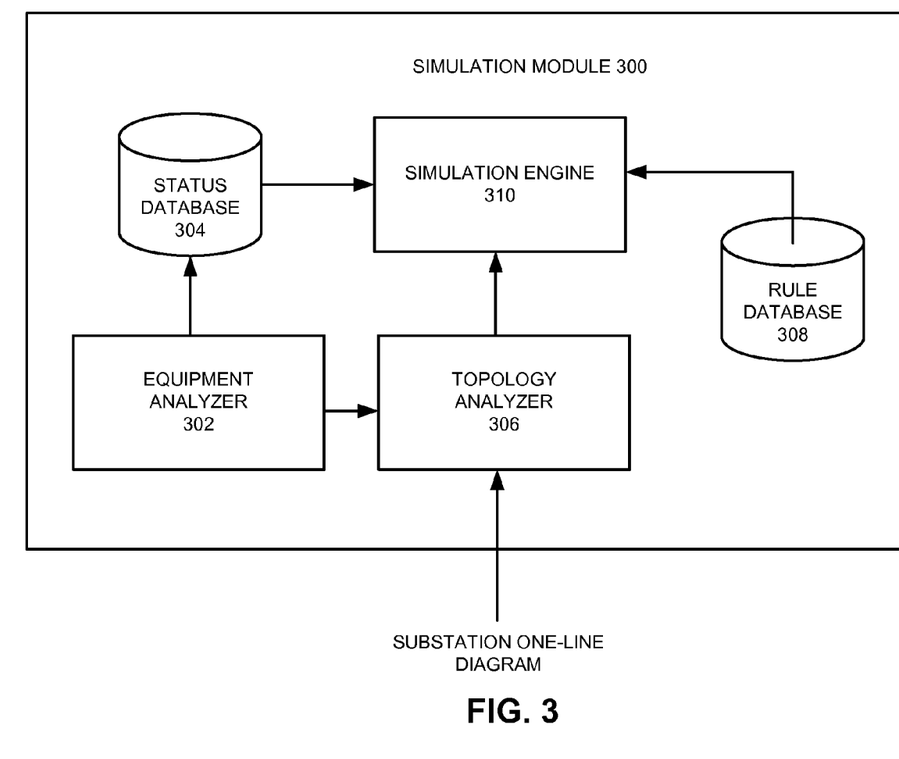
FIG. 3 presents a diagram illustrating the architecture of the simulation module, in accordance with an embodiment of the present invention.

During operation, state machine 204 receives the current equipment status information for a substation, including status information of automated devices collected by a supervisory control and data acquisition (SCADA) system and status information of manually operated devices collected by smart keys, which performs the remote operation surveillance for the SIS, and sends the equipment status information to simulation module 202. Simulation module 202 performs switching sequence simulation using current equipment status, topology information extracted from the substation one-line diagram, and the switching interlock logic and rules. The detailed structure of simulation module 202 is shown in FIG. 3. Based on the simulation result, simulation module 202 generates a switching order. User interface 206 displays possible error information and system warnings, and communicates with the smart key. In addition, control module 208 issues control commands to the SCADA system to realize the remote control operations.

Simulation-and-control system 200 can reside on any type of computer system based on microprocessors, such as a standalone mainframe computer or a cluster of computer servers. In one embodiment, simulation-and-control system 200 resides on a handheld device, such as a smart key, to enable real-time, in-the-field simulation. Note that due to the input/output or computation constraints of a handheld device, it is possible to have only a portion of simulation-and-control system 200 (such as simulation module 202) to resides on the handheld device, while other modules of simulation-and-control system 200 remain on a centralized server.

FIG. 3 presents a diagram illustrating the architecture of the simulation module, in accordance with an embodiment of the present invention. Simulation module 300 includes an equipment analyzer 302, a status database 304, a topology analyzer 306, a rule database 308, and a simulation engine 310.

Equipment analyzer 302 analyzes the structural components of each piece of equipment associated with the switching operation, and decomposes a piece of complex equipment into a number of basic components, such as circuit breakers, disconnects, and ground disconnects, that fulfill the electrical functionality of the complex equipment. For example, a three-position knife switch is decomposed to two basic components: a knife switch and a ground knife switch. The three switching positions correspond to different switching positions of the knife switch and the ground knife switch. Note that after a piece of complex equipment is decomposed into multiple basic components, connections to other external equipment are mapped onto corresponding ends on the basic components. The output of equipment analyzer 302, including the status of the basic components and their connection information, is stored in status database 304. Note that the status information of the components can be updated by the smart key. In one embodiment, after each operation, the smart key updates the status of the equipment being operated on. Such an arrangement makes it possible for the system to maintain real-time status information of all equipment, including manually operated equipment in the field, such as a manual switch or a locked door for a switching bay.

Topology analyzer 306 analyzes the topology of a substation based on the one-line diagram and the decomposition outcome of each piece of complex equipment. In one embodiment, topology analyzer 306 constructs a node table, which includes the status of the nodes and connection information among the nodes. Note that each node in the node table corresponds to a topology node extracted from the one-line diagram of the substation. In one embodiment, a topology node corresponds to a crossing point on the one-line diagram, which can include one or more equipment endpoints. Note that a single topology node may be associated with multiple endpoints, whereas a particular endpoint can only be associated with a single topology node.

Rule database 308 stores switching interlock logic and rules, which can be either programmed ahead of time by the manufacturer of the SIS or defined by the user of the SIS. For example, to prevent operations on a loaded knife switch, rule database 308 stores a rule stating that no operation (either opening or closing) is allowed on a knife switch when the knife switch is coupled to a closed circuit breaker. Note that these rules generally describe allowed or disallowed operations of basic components, regardless of their relative locations in the system topology. The independent relationship between rule database 308 and the system topology provides scalability for the SIS. When the substation scales up, such as with the addition of new equipment, instead of reprogramming the entire simulation software, one only needs to input the updated one-line diagram into topology analyzer 306. Moreover, when safety rules and regulations are changed, only rule database 308 needs to be updated. Such updating can be made by users of the SIS. In one embodiment, the switching interlock logic and rules are stored in a table, and the user is allowed to add, delete, or make changes to the table entries. In a further embodiment, an entry in rule database 308 includes three components: equipment type, operation type, and expression of the rule specific to the equipment and the operation. The equipment type component specifies the type of equipment (such as breakers, knife switches, and ground wires) that this rule is applied to; the operation type specifies which operation (such as opening or closing) that this rule is applied to; and expression of the rule is a logic expression describing the error-prevention rule. Such a logic expression is specific to the type of equipment and the type of operation, and remains unrelated to any specific piece of equipment within the system. In the aforementioned example, a corresponding entry for closing a knife switch in rule database 308 can be expressed as: KNIFE SWITCH, CLOSING: KNIFE SWITCH UNLOADED. Such a rule is applied to all knife switches in the system, including a knife switch that was included in and decomposed from a piece of complex equipment.

Once the system receives an operation request on a piece of equipment, simulation engine 310 performs a simulation to determine whether the requested operation is allowed based on the topology node table constructed by topology analyzer 306, equipment status information extracted from status database 304, and operation rules extracted from rule database 308.

Figure 4A:
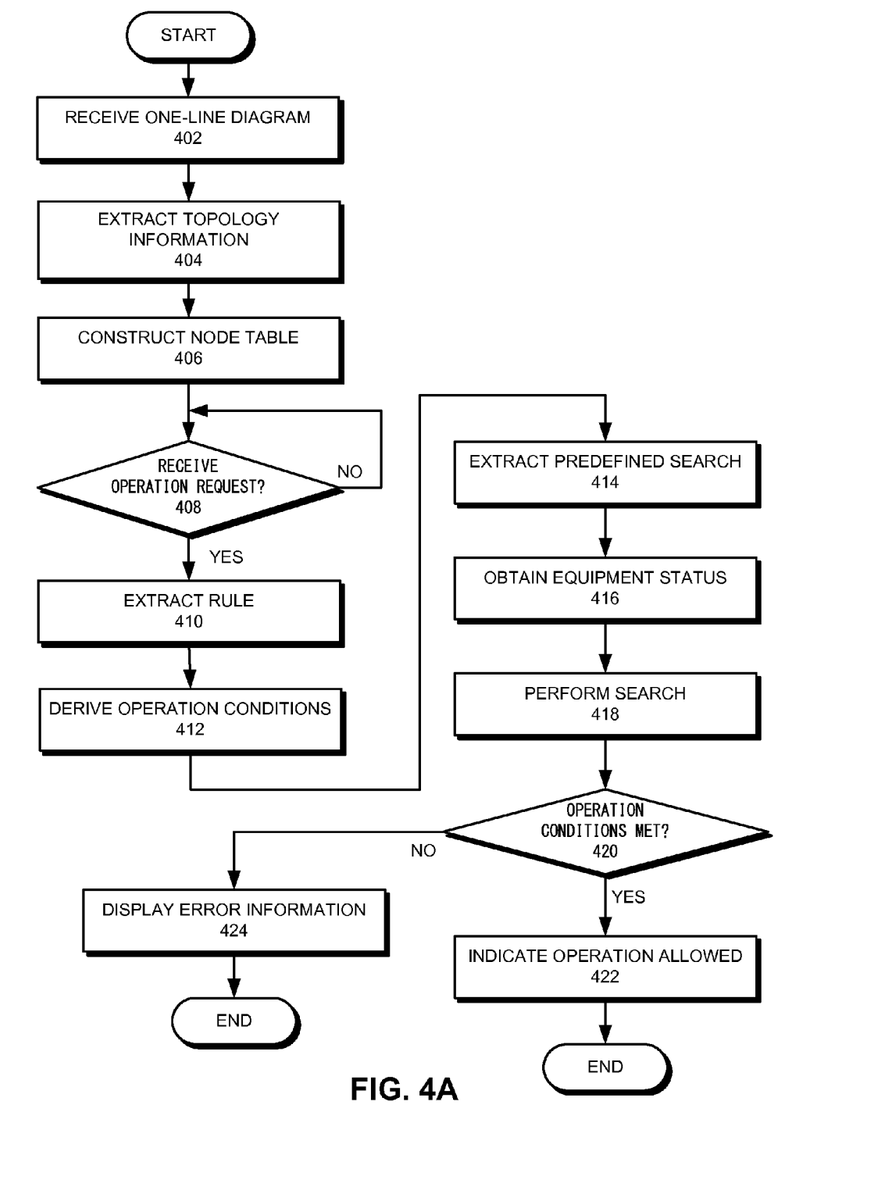
FIG. 4A presents a flow chart illustrating the operation process of the switching-error prevention system, in accordance with an embodiment of the present invention.

FIG. 4A presents a flow chart illustrating the operation process of the switching-error prevention system, in accordance with an embodiment of the present invention. Prior to receiving a request to perform a switching operation, the system goes through an initialization process, which includes receiving the one-line diagram of a power plant or a substation (operation 402), extracting topology information from the one-line diagram (operation 404), and constructing a topology node table (operation 406). Note that this initialization process can be performed when the power system is brought online, or when the power system experiences equipment update. The system waits for a request for an operation on a particular piece of equipment, such as a request for closing a knife switch (operation 408). Upon receiving such a request, the system extracts a rule associated with the equipment and the operation from the rule database (operation 410). Based on the rule, the system derives a number of operating conditions complying with the rule (operation 412). For example, a rule associated with closing a knife switch states that such an operation requires that the knife switch be unloaded, and the operating conditions that satisfy this rule include: all circuit breakers coupled to the knife switch being open, and at least one side of the knife switch being unloaded.

Based on the derived operating conditions, the system defines a search that starts from one or more endpoints of the equipment and traverses the electrical connectivity topology (operation 414). The targets and boundary of the search are defined by the operating conditions. For example, to determine whether the condition of all coupled circuit breakers being open is met, the system first defines a search boundary, which includes circuit breakers and open knife switches. In other words, a search originating from a node and traversing the topology will come to a stop once a circuit breaker or an open knife switch is met. The search target is a closed circuit breaker. Note that if the search returns a closed circuit breaker, it indicate a violation of the operation condition. Similarly, to determine whether the condition of at least one end of the knife switch being unloaded is met, the system first defines a search boundary, which includes open circuit breakers and open knife switch. The search targets include loaded devices or a power supplies. The system then obtains the current status of the equipment within the topology (operation 416). In one embodiment, the system interfaces with an EMS (Energy Management System)/SCADA system to obtain the current operational status (such as positions of a switch) of the equipment. In a further embodiment, the current status of the equipment can be obtained by the smart key.

Subsequently, the system performs the search that traverses the topology (operation 418). The search starts from one or more endpoints of the equipment. In the example of the knife switch, the search starts from both ends of the knife switch. The search traverses the electrical connectivity topology, and collects equipment associated with the operating conditions. For example, using the operating condition that all circuit breakers coupled to the knife switch are open, the system defines a search boundary that includes open circuit breakers and open knife switches, and the search targets include loaded devices and power supplies. Based on the search result and the current equipment status, the system determines whether the operating conditions are met (operation 420). If the operating conditions are met, the system indicates to the user that the operation is allowed (operation 422). Otherwise, the system displays error information to the user (operation 424). In one embodiment, the error information includes the search result indicating the violated operating condition. In the example of the knife switch, the search may find a coupled circuit breaker having a current status of being closed, and indicate to the user that operations on the knife switch are prohibited due to the status of that particular circuit breaker. Note that such information can be used by the user to correct the situation. In the above example, the error information indicates that operations on the knife switch are prohibited because a coupled circuit breaker is closed. The user can then attempt to open the circuit breaker first in order to operate on the knife switch. In a further embodiment, if the violated operating condition is not a critical condition (such as a one that does not violate a safety rule), the error message may include an option that allows the user to override the decision made by the system. Based on the user's input, the system may indicate that such an operation is allowed or not.

In one embodiment, to ensure that the requested switching operation remains safe, the system performs the switching-sequence simulation on a handheld device right before a field staff member performs the switching operation. For example, in order to perform the switching operation, a field staff member needs to use a smart key to unlock a lock attached to the switching equipment; and before unlocks the lock, the smart key is configured to obtain the instant equipment status and run the switching-sequence simulation using the newly obtained equipment status. In one embodiment, the smart key is unable to unlock the lock unless the simulation result indicates the switching operation is allowed. Because this simulation is run real-time, it ensures the validity of the simulation result.

Figure 4B:
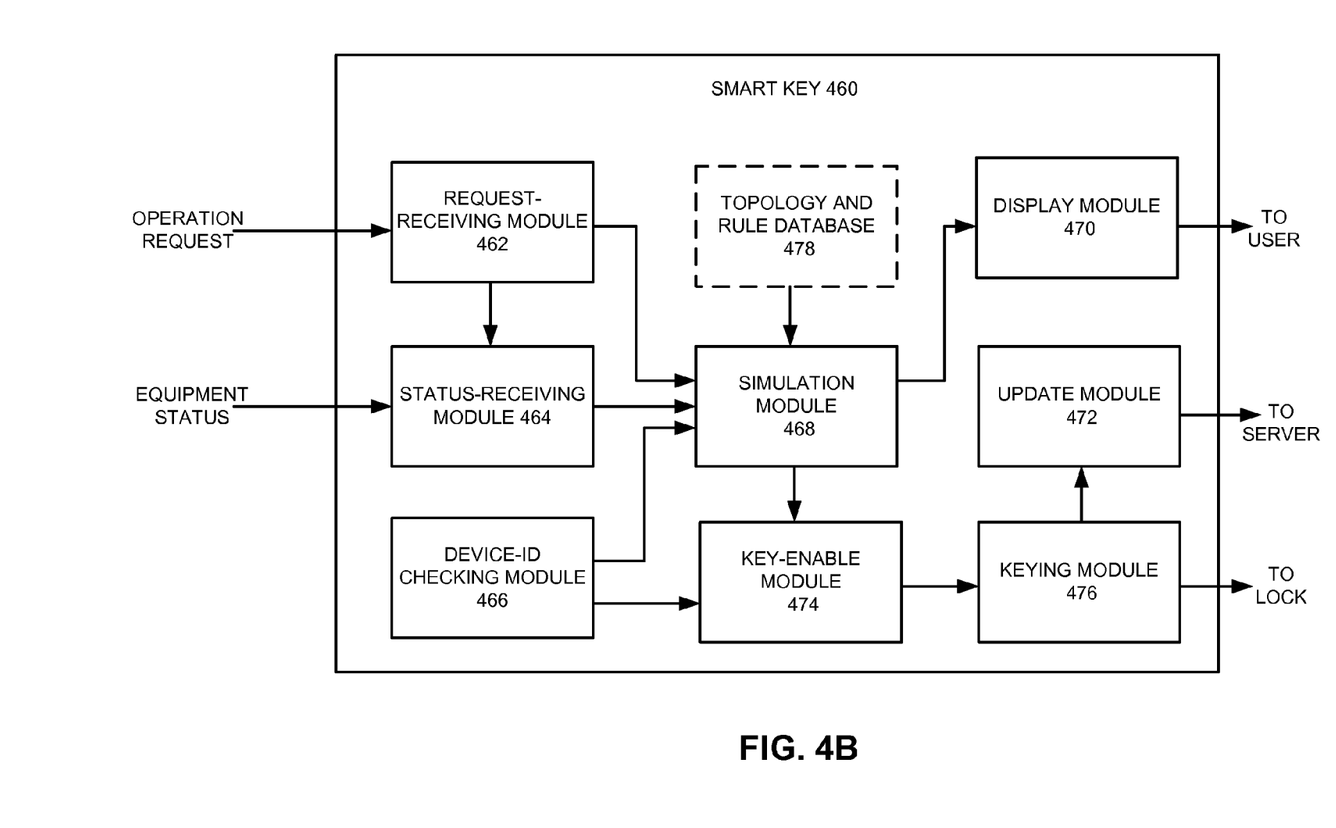
FIG. 4B presents a diagram illustrating the architecture of a handheld device for performing the real-time, in-the-field simulation, in accordance with an embodiment of the present invention.

Since it is less likely for the system topology or the interlock logic and rules to make sudden changes, there is no need for the smart key to perform topology analysis or to update its rule database with user-defined rules. Instead, the smart key can receive topology information (such as the node table) and the rules from a remote server, which performs the topology analysis and rule update. FIG. 4B presents a diagram illustrating the architecture of a smart key for performing the real-time, in-the-field simulation, in accordance with an embodiment of the present invention. In FIG. 4B, a smart key 460 includes a request-receiving module 462, a status-receiving module 464, a device-ID checking module 466, a simulation module 468, a display module 470, an update module 472, a key-enable module 474, a keying module 476, and an optional topology and rule database 478.

Prior to performing a switching operation, a field staff member carries smart key 460 to the field where the switching device is located. Request-receiving module 462 receives a request from the field staff member for performing the operation, which triggers status-receiving module 464 to receive the real-time status of other equipment within the substation. In one embodiment, status-receiving module 464 communicates with a SCADA system associated with the substation to receive the most up-to-date status information. Device-ID checking module 466 is configured to check the identity of the switching device to be operated on. In one embodiment, device-ID checking module 466 detects an RFID embedded in a lock attached to the switching device. Based on the received operation request, the received real-time equipment status, and the determined device ID simulation module 468 runs a switching-sequence simulation to determine whether the requested operation is allowed. In one embodiment, simulation module 468 also retrieves topology information and rules from topology and rule database 478 in order to run a simulation based on the topology and rules. In a further embodiment, the topology and rules are encoded in the simulation program.

Display module 470 displays the outcome of the simulation. If the simulation result indicates the operation is not allowed, display module 470 displays an error message. If both the outputs of device-ID checking module 466 and simulation module 468 are positive, key-enable module 574 enables keying module 476, thus allowing smart key 460 to unlock a lock attached to the switching device. Once the lock is unlocked, the field staff member can proceed with the switching operation. Operation details of key-enable module 474 and keying module 476 can be found in U.S. patent application Ser. No. 13/475,451, entitled "INTERCHANGEABLE LOCK CORE AND OPENING METHOD THEREOF," by inventors Shuqiang Jin, Qing Chang, Hongwei Qiao, Lei Ji, and Shuiping Liao, filed 18 May 2012, the disclosure of which is incorporated by reference in its entirety herein. Update module 472 updates the status of this switching device after the switching operation is performed. For example, after a switching operation on a knife switch is performed, update module 472 updates the current position of the switch handle. Note that each switch handle position corresponds to a lock; hence smart key 460 is capable of track the handle position by tracking which locks have been operated on.

Figure 4C:
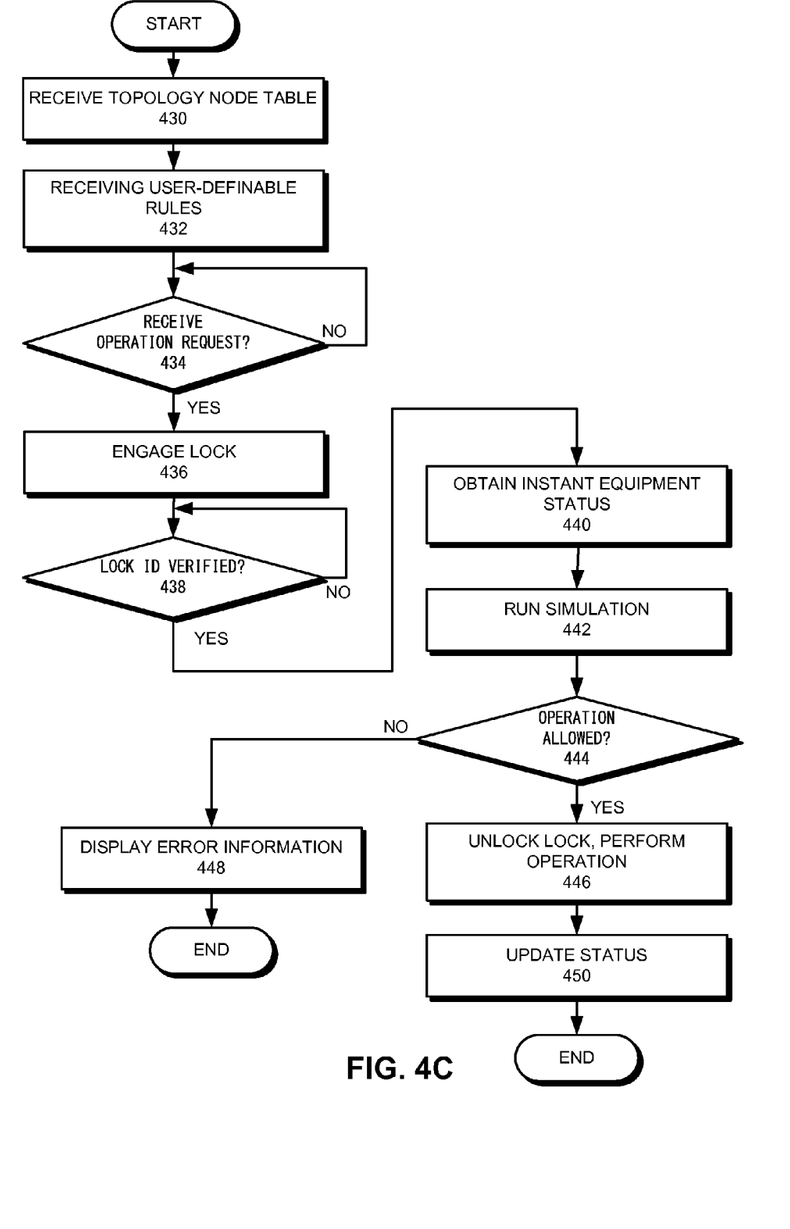
FIG. 4C presents a flowchart illustrating the process of performing a real-time, in-the-field simulation, in accordance with an embodiment of the present invention.

FIG. 4C presents a flowchart illustrating the process of performing a real-time, in-the-field simulation, in accordance with an embodiment of the present invention. Prior to performing the real-time, in the field operation, the handheld device or the smart key receives the topology node table from the SIS server (operation 430). In addition, the smart key also receives the user-definable rules stored in the rule database from the SIS server (operation 432). Note that to ensure that the smart key has the updated version of the topology and rules, in one embodiment, each time the server updates the topology or rules, the server will notify the smart key to re-download the topology node table and rules. Subsequently, the smart key waits to receive a request for an operation on a piece of equipment (operation 434). In one embodiment, the smart key receives the operation request directly from a user. For example, a holder of the smart key can manually input a command on the smart key. In a further example, the smart key receives the operation request from the SIS server. For example, a control staff member issues an operation request at the SIS server, which approves and forwards the request to the smart key.

Before the switching operation is performed, a field staff member carries the smart key to the field and uses the smart key to engage a lock associated with the switching operation (operation 436). For example, before swinging the handle of a knife switch, the field staff member needs to unlock a lock attached to the handle by inserting the key head of the smart key into the lock. In one embodiment, when the smart key engages the lock, it verifies the lock identifier (operation 438). If the lock-ID has been verified, the smart key obtains the instant equipment status of the power system (operation 440). In one embodiment, the smart key obtains the instant equipment status information from a SCADA system that monitors equipment status for the power system. In a further embodiment, the smart key obtains the instant equipment status from the SIS server. Subsequently, the smart key runs a simulation based on the operation request and the instant equipment status (operation 442). In one embodiment, the simulation operation is similar to operations 410-420 shown in FIG. 4A, which involve performing one ore more searches that traverse the topology. In a further embodiment, the simulation can be any other type of error-prevention simulation which may or may not involve a search based on user definable rules. Based on the simulation outcome, the system determines whether the operation is allowed (operation 444). If so, the smart key is enable to unlock the lock (operation 446). Immediately after the corresponding lock is unlocked, the field staff member performs the switching operation. If the operation is not allowed, the smart key displays error information to the user (operation 448). Subsequent to the switching operation, the smart key updates the status of this particular equipment (operation 450).

Note that it is advantageous to have the smart key to record and update the equipment status. Conventional power systems often rely on a SCADA system to monitor the status of the equipment. However, the SCADA system can only monitor and collect status information from equipment that is automatically operated or installed with sensors. In a transmission substation, many switching devices are manually operated and installing sensors on all manual equipment can be unpractical. Hence, the SCADA system alone cannot provide all updated statuses for all equipment. For example, the connection status of a temporary ground wire may not be available to the SCADA system. On the other hand, because connecting or disconnecting the temporary ground wire involves unlocking one or more locks associated with the ground wire, the connection status of the ground wire can be obtained by the smart key. By updating the status of a device each time after an operation has been performed on the device, the smart key is able to track the status of all equipment in the power system, including manually operated equipment, such as a temporary ground wire or a knife switch.

An Operation Example

Figure 5:
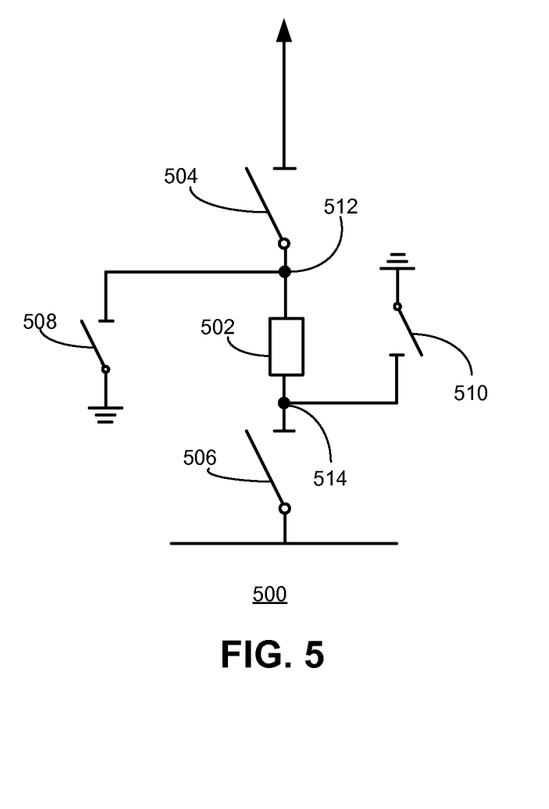
FIG. 5 presents a portion of an exemplary one-line diagram.

FIG. 5 presents a portion of an exemplary one-line diagram. One-line diagram 500 includes a breaker 502, two knife switches 504 and 506, and two ground switches 508 and 510. During initialization, the switching-error prevention system extracts connectivity topology information from one-line diagram 500 and constructs a node table. The node table includes a number of topology nodes (such as nodes 512 and 514) and connectivity information associated with the switching devices. For example, one endpoint of ground switch 510 is coupled to an endpoint of knife switch 506 and an endpoint of breaker 502 at node 514.

Upon receiving an operation request to close ground switch 510, the system extracts a rule stating that before the closing operation can take place on a ground switch, the ground switch needs to be isolated from other equipment. Based on the rule, the system determines that the corresponding operating condition is that all knife switches coupled to ground switch 510 remain open. Based on the operating condition, the system defines a search for a closed knife switch coupled to ground switch 510. This search starts from the ungrounded end of ground switch 510, and traverses the entire topology. The search boundary includes knife switches and the search targets include closed knife switches. An empty search result indicates that ground switch 510 is isolated from other equipment. Consequently, the system determines that the operating condition is met, and the operation of closing ground switch 510 is allowed. Note that if a knife switch coupled to ground switch 510, such as knife switch 506, is closed, the system will determine that the requested closing operation of ground switch 510 is prohibited, and display an error message to the user. The message can notify the user that the requested operation is prohibited because knife switch 506 is closed.

User Interface

Figure 6:
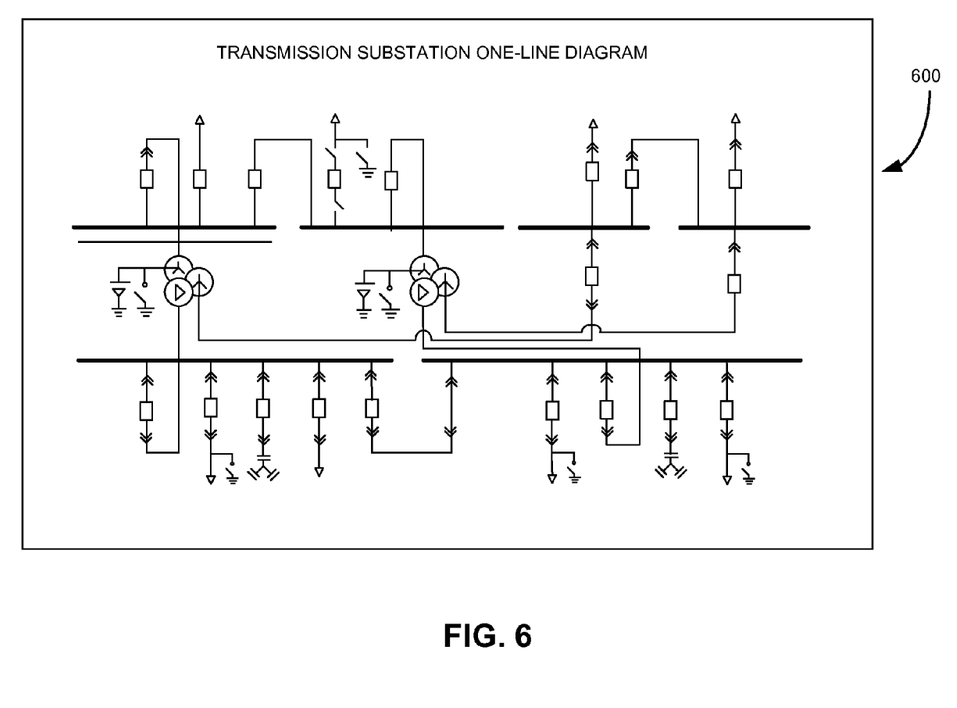
FIG. 6 presents a diagram illustrating an exemplary user interface, in accordance with an embodiment of the present invention.

FIG. 6 presents a diagram illustrating an exemplary user interface, in accordance with an embodiment of the present invention. In one embodiment, the switching-error prevention system includes a graphic user interface (GUI) that enables a user to interact with the switching-error prevention system.

The GUI can be presented to the user on various types of display mechanisms, such as a standard computer display or a touch-screen display. In FIG. 6, GUI 600 displays the one-line diagram of a substation. In one embodiment, the displayed one-line diagram also displays the current status of the equipment, such as a switch being open or closed. A user can request an operation on a piece of switching equipment by pointing and clicking an icon on the diagram corresponding to the equipment. The simulation result in response to the operation request is presented to the user via GUI 600.

In one embodiment of the present invention, GUI 600 can switch the view from the one-line diagram shown in FIG. 6 to a view that displays a table associated with the rule database. The table view of the rule database enables the user to make changes to the rule database by adding, deleting, and modifying entries in the table.

Computer System

Figure 7:
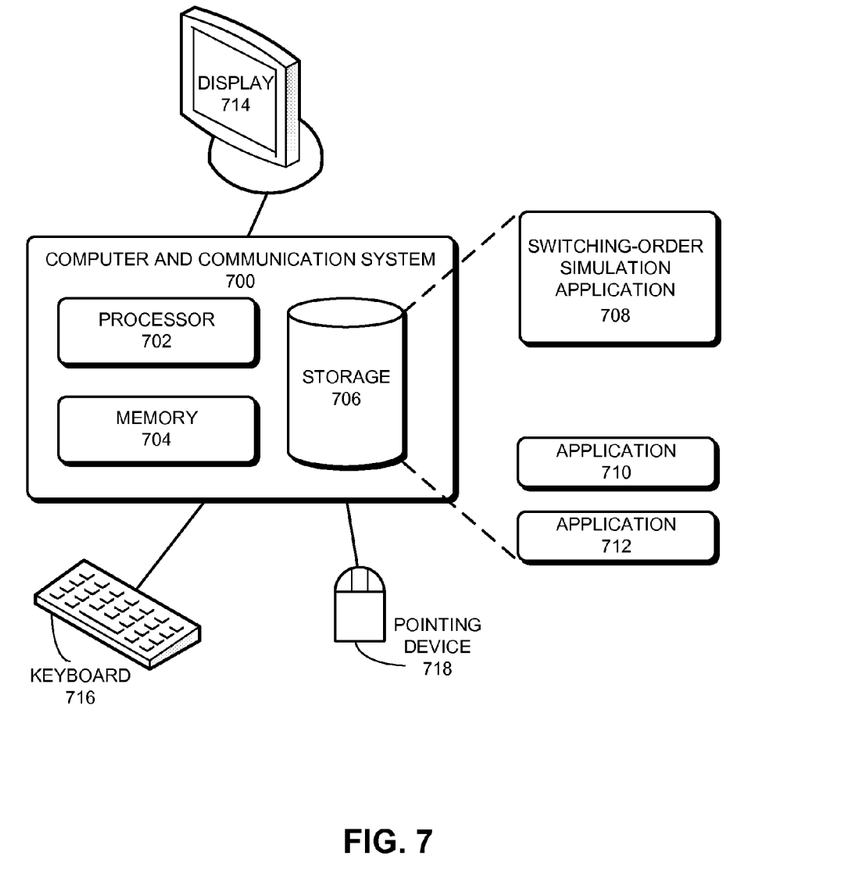
FIG. 7 presents a diagram illustrating an exemplary computer system for performing switching-order simulations, in accordance with an embodiment of the present invention.

FIG. 7 presents a diagram illustrating an exemplary computer system for performing switching-order simulations, in accordance with an embodiment of the present invention. In one embodiment, a computer and communication system 700 includes a processor 702, a memory 704, and a storage device 706. Storage device 706 stores a switching-order simulation application 708, as well as other applications, such as applications 710 and 712. During operation, switching-order simulation application 708 is loaded from storage device 706 into memory 704 and then executed by processor 702. While executing the program, processor 702 performs the aforementioned functions. Computer and communication system 700 is coupled to an optional display 714, keyboard 716, and pointing device 718. The display, keyboard, and pointing device can facilitate switching-order simulation.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A method for performing a real-time, in-the-field switching-sequence simulation for a power system that includes a plurality of switching devices, comprising:
   receiving, at a smart key, a first simulation result indicating that an operation on a switching device is allowed, wherein the first simulation is performed at a first site, and wherein the switching device is located at a second site;
   receiving a request, from a user at the smart key which is carried to a vicinity of the switching device at the second site, to perform the operation on the switching device;
   in response to the request, identifying the switching device from the plurality of switching devices;
   obtaining instant status information associated with the plurality of switching devices;
   and running a second simulation, at the smart key located in the vicinity of the switching device, based on the instant status information and the identified switching device;
   and
   in response to determining that the operation is allowed based on an outcome of the second simulation, unlocking, by the smart key, a lock associated with the switching device, thus facilitating performance of the operation.

2. The method of claim 1, wherein identifying the switching device involves using the smart key to check an RFID associated with the switching device.

3. The method of claim 1, wherein the plurality of switching devices includes one or more automated switching devices and one or more manually operated switching devices.

4. The method of claim 1, further comprising updating status of the switching device after the operation is performed.

5. The method of claim 1, further comprising:
   in response to the operation being allowed based on the outcome of the second simulation, displaying a message to the user indicating the operation being allowed;
   and in response to the operation not being allowed based on the outcome of the second simulation, displaying an error message.

6. The method of claim 1, further comprising:
   receiving, at the smart key, topology information associated with the power system; and
   receiving a set of user-definable rules that are independent of the power system topology.

7. The method of claim 6, wherein running the second simulation involves defining and performing a search that traverses the power system topology based on the set of rules.

8. A non-transitory computer-readable storage medium storing instructions that when executed by a computer cause the computer to perform a method for performing a real-time, in-the-field switching-sequence simulation for a power system that includes a plurality of switching devices, wherein the method comprises:

receiving, at a smart key, a first simulation result indicating that an operation on a switching device is allowed, wherein the first simulation is performed at a first site, and wherein the switching device is located at a second site;

receiving a request, from a user at the smart key which is carried to a vicinity of the switching device at the second site, to perform the operation on the switching device;

in response to the request, identifying the switching device from the plurality of switching devices;

obtaining instant status information associated with the plurality of switching devices;

and running a second simulation, at the smart key located in the vicinity of the switching device, based on the instant status information and the identified switching device;

and in response to determining that the operation is allowed based on an outcome of the second simulation, enabling the smart key to unlock a lock associated with the switching device, thus facilitating performance of the operation.

9. The computer-readable storage medium of claim 8, wherein identifying the switching device involves using the smart key to check an RFID associated with the switching device.

10. The computer-readable storage medium of claim 8, wherein the plurality of switching devices includes at least one or more automated switching devices and one or more manually operated switching devices.

11. The computer-readable storage medium of claim 8, wherein the method further comprises updating status of the switching device after the operation is performed.

12. The computer-readable storage medium of claim 8, wherein the method further comprises:

in response to the operation being allowed based on the outcome of the second simulation, displaying a message to the user indicating the operation being allowed;

and in response to the operation not being allowed based on the outcome of the second simulation, displaying an error message.

13. The computer-readable storage medium of claim 8, wherein the method further comprises:

receiving, at the smart key, topology information associated with the power system; and receiving a set of user-definable rules that are independent of the power system topology.

14. The computer-readable storage medium of claim 13, wherein running the second simulation involves defining and performing a search that traverses the power system topology based on the set of rules.

15. A smart key for performing a real-time, in-the-field switching-sequence simulation for a power system that includes a plurality of switching devices, comprising:

a receiving mechanism configured to receive a first simulation result indicating that an operation on a switching device is allowed, wherein the first simulation is performed at a first site, and wherein the switching device is located at a second site;

a request-receiving mechanism configured to receive, from a user, a request to perform the operation on the switching device;

an identifying mechanism configured to identify the switching device from the plurality of devices;

a status-obtaining mechanism configured to obtain instant status information associated with the plurality of switching devices;

a simulation mechanism configured to run a second simulation based on the instant status information and the identified switching device;

a determination mechanism configured to determine whether the operation is allowed based on an outcome of the second simulation;

and an enabling mechanism configured to enable, in response to the determination mechanism determining that the operation is allowed, a key head located on the smart key to unlock a lock associated with the switching device, thus facilitating performance of the operation.

16. The smart key of claim 15, wherein the identifying mechanism is configured to identify the switching device by checking an RFID associated with the switching device.

17. The smart key of claim 15, wherein the plurality of switching devices include one or more automated switching devices and one or more manually operated switching devices.

18. The smart key of claim 15, further comprising an update mechanism configured to update status of the switching device after the operation is performed.

19. The smart key of claim 15, further comprising a display mechanism configured to:

in response to the operation being allowed based on an outcome of the second simulation, display a message to the user indicating the operation being allowed;

and in response to the operation not being allowed based on an outcome of the second simulation, display an error message.

20. The smart key of claim 15, further comprising a memory configured to store topology information associated with the power system and a set of user-definable rules that are independent of the power system topology.

21. The smart key of claim 20, wherein while running the second simulation, the simulation mechanism is configured to define and perform a search that traverses the power system topology based on the set of rules.

* * * * *